(12) United States Patent
Heisserman

(10) Patent No.: US 12,361,181 B2
(45) Date of Patent: Jul. 15, 2025

(54) LOGICAL TRAVERSAL OF SOLID MODELS

(71) Applicant: The Boeing Compay, Chicago, IL (US)

(72) Inventor: Jeff Alan Heisserman, Clinton, WA (US)

(73) Assignee: The Boeing Company, Chicago, IL (US)

( * ) Notice: Subject to any disclaimer, the term of this patent is extended or adjusted under 35 U.S.C. 154(b) by 880 days.

(21) Appl. No.: 17/305,300

(22) Filed: Jul. 2, 2021

(65) Prior Publication Data
US 2023/0004683 A1 Jan. 5, 2023

(51) Int. Cl.
*G06F 30/10* (2020.01)
*G06T 19/20* (2011.01)
*G06F 30/15* (2020.01)

(52) U.S. Cl.
CPC .............. *G06F 30/10* (2020.01); *G06T 19/20* (2013.01); *G06F 30/15* (2020.01); *G06T 2219/2008* (2013.01)

(58) Field of Classification Search
CPC ......... G06F 30/10; G06F 30/15; G06T 19/20; G06T 2219/2008
See application file for complete search history.

(56) References Cited

U.S. PATENT DOCUMENTS

| 7,444,269 | B2 | 10/2008 | Drumheller |
| 8,914,149 | B2 | 12/2014 | Safa-Bakhsh et al. |
| 9,372,917 | B1 | 6/2016 | Saylor et al. |
| 9,508,047 | B2 | 11/2016 | McIver et al. |
| 9,652,584 | B2 | 5/2017 | Hansen et al. |
| 10,062,052 | B2 | 8/2018 | Saylor et al. |
| 2010/0262451 | A1 | 10/2010 | Bahrami et al. |
| 2014/0288893 | A1 | 7/2014 | Blom et al. |
| 2019/0228372 | A1 | 7/2019 | Saylor et al. |
| 2021/0295956 | A1* | 9/2021 | Adhikari ............... H04L 9/3239 |
| 2021/0365499 | A1* | 11/2021 | Matiushkin ......... G06F 16/9038 |
| 2022/0027526 | A1* | 1/2022 | Ruedisueli ............. A46B 11/06 |

OTHER PUBLICATIONS

Kallimanis, Nikolaos, Wait-Free Concurrent Graph Objects with Dynamic Traversals, 2015, 19th International Conference on Principles of Distributed Systems (OPODIS 2015 (Year: 2015).*

Heissermann; "Generative geometric design and boundary solid grammars"; Carnegie Mellon University Pittsburgh, PA, USA; 1992.

Heisserman; "Generative Geometric Design"; IEEE Computer Graphics and Applications; vol. 14, No. 2; Mar. 1994.

(Continued)

*Primary Examiner* — Andre Pierre Louis
(74) *Attorney, Agent, or Firm* — Yee & Associates, P.C.

(57) ABSTRACT

A method for designing solid models, computer system, and computer program product are presented. The computer system receives a model of a three dimensional solid. The computer system determines at least one of vertices, edges, and faces for the model. The computer system traverses the at least one of vertices, edges, and faces of the model to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traversing.

25 Claims, 8 Drawing Sheets

(56) References Cited

OTHER PUBLICATIONS

Heisserman et al.; "Representing Relationships in Hierarchical Assemblies"; in Proceedings of ASME Design Engineering Technical Conferences; Atlanta, GA; Sep. 13-16, 1998.
Heisserman et al.; "A design representation to support automated design generation"; in Proceedings of Artificial Intelligence in Design, Worcester, Massachusetts; Jun. 26-29, 2000.
Drumheller; "Constraint-Based Design of Optimal Transport Elements"; Journal of Computing and Information Science in Engineering; Dec. 2002; vol. 2, No. 4; pp. 302-311.
Weiler; "Edge-Based Data Structures for Solid Modeling in Curved-Surface Environments"; IEEE Computer Graphics and Applications; vol. 5, No. 1; Jan. 1985; pp. 21-40.

* cited by examiner

LOGICAL TRAVERSAL OF SOLID MODELS

BACKGROUND INFORMATION

1. Field

The present disclosure relates generally to computer-aided design (CAD) files and, more specifically, to a system and method for logically traversing solid models.

2. Background

In modern manufacturing, large, complex, and challenging products are designed and manufactured utilizing computer-aided (CAD) files. CAD files are three-dimensional computer models that can be used to represent physical parts to be manufactured. CAD files can be used to perform simulations or to generate manufacturing instructions for equipment such as additive manufacturing equipment or computer numerical control (CNC) manufacturing equipment.

Designing products may include families of designs and design alternatives, composed of millions of parts and components. Managing, designing, and analyzing this many components by human operators can be undesirably time-consuming and/or expensive. The precision necessary for generating instructions for manufacturing equipment is undesirably difficult and time-consuming. Additionally, after each modification, a design must be re-evaluated.

Therefore, it would be desirable to have a method and apparatus that take into account at least some of the issues discussed above, as well as other possible issues. It would be desirable to use automation or optimization tools to design and/or manage complex products. In addition, it would be desirable to provide ways of providing access to the geometric data of a solid model in a logically consistent way.

SUMMARY

An embodiment of the present disclosure provides a method in a computer system for designing solid models that are manifold or non-manifold solids. A model of a three-dimensional solid is received by the computer system. At least one of vertices, edges, and faces for the model is determined by the computer system. The at least one of vertices, edges, and faces of the model is traversed by the computer system to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traversing, wherein the traversing is configured to be performed on the model independent of whether the model is a manifold solid or a non-manifold solid.

Another embodiment of the present disclosure provides a computer system for designing solid models that are manifold or non-manifold solids. The computer system comprises a bus system, a storage device connected to the bus system, and a processor connected to the bus system. The storage device stores program instructions. The processor executes the program instructions to: receive a model of a three dimensional solid; determine at least one of vertices, edges, and faces for the model; and traverse the at least one of vertices, edges, and faces of the model to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traverse, wherein the program instructions are configured to traverse the at least one of vertices, edges, and faces of the model independent of whether the model is a manifold solid or a non-manifold solid.

Yet another embodiment of the present disclosure provides a computer program product. The computer program product comprises a computer-readable storage medium including instructions for organizing data sets, the instructions comprising first program code for receiving a model of a three-dimensional solid, second program code for determining at least one of vertices, edges, and faces for the model, and third program code for traversing the at least one of vertices, edges, and faces of the model to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traversing, wherein the traversing is configured to be performed on the model independent of whether the model is a manifold solid or a non-manifold solid.

A further embodiment of the present disclosure provides a method in a computer system for designing solid models that are manifold or non-manifold solids. A model of a three-dimensional solid is received by the computer system. A design requirement is received by the computer system. At least one of vertices, edges, and faces to be traversed is determined by the computer system based on the design requirement. The computer system traverses the at least one of vertices, edges, and faces of the model based on the design requirement to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traversing, wherein the traversing is configured to be performed on the model independent of whether the model is a manifold solid or a non-manifold solid.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that basic solids are represented by their boundary elements, such as vertices, edges, and faces. The illustrative embodiments recognize and take into account that to analyze both manifold and non-manifold solids, the representation can include vertices, vertex uses, edges and edge uses, faces, loops, shells and shell uses (independent surfaces), and solids (combination of all other). The illustrative embodiments recognize and take into account that non-geometric data can be associated with any of the vertices, edges, or faces.

The illustrative embodiments recognize and take into account that there are several commercially available CAD formats and programs. The illustrative embodiments also recognize and take into account that commercial CAD and design systems can be used to develop large-scale, complex products, but these commercially available programs have limitations. Existing computer-aided design (CAD) and geometry systems provide ad hoc, implementation specific and often proprietary interfaces to their geometric and design representations. The illustrative embodiments recognize and take into account that none of the available systems provides a comprehensive logical reasoning capability.

The illustrative embodiments recognize and take into account that using proprietary interfaces drives substantial engineering time and cost into developing these capabilities and especially in migrating these capabilities from current underlying systems into next generation systems.

The illustrative examples provide the methods and computational foundation for a logical reasoning system that operates on the geometric and topological representations of solid models. These illustrative examples enable automated reasoning that incorporates engineering design knowledge and design rules for developing large-scale, integrated product designs. These illustrative examples in turn enable reductions in non-recurring and recurring engineering labor during product development, improved design quality, and reduced development costs.

Figure 1:
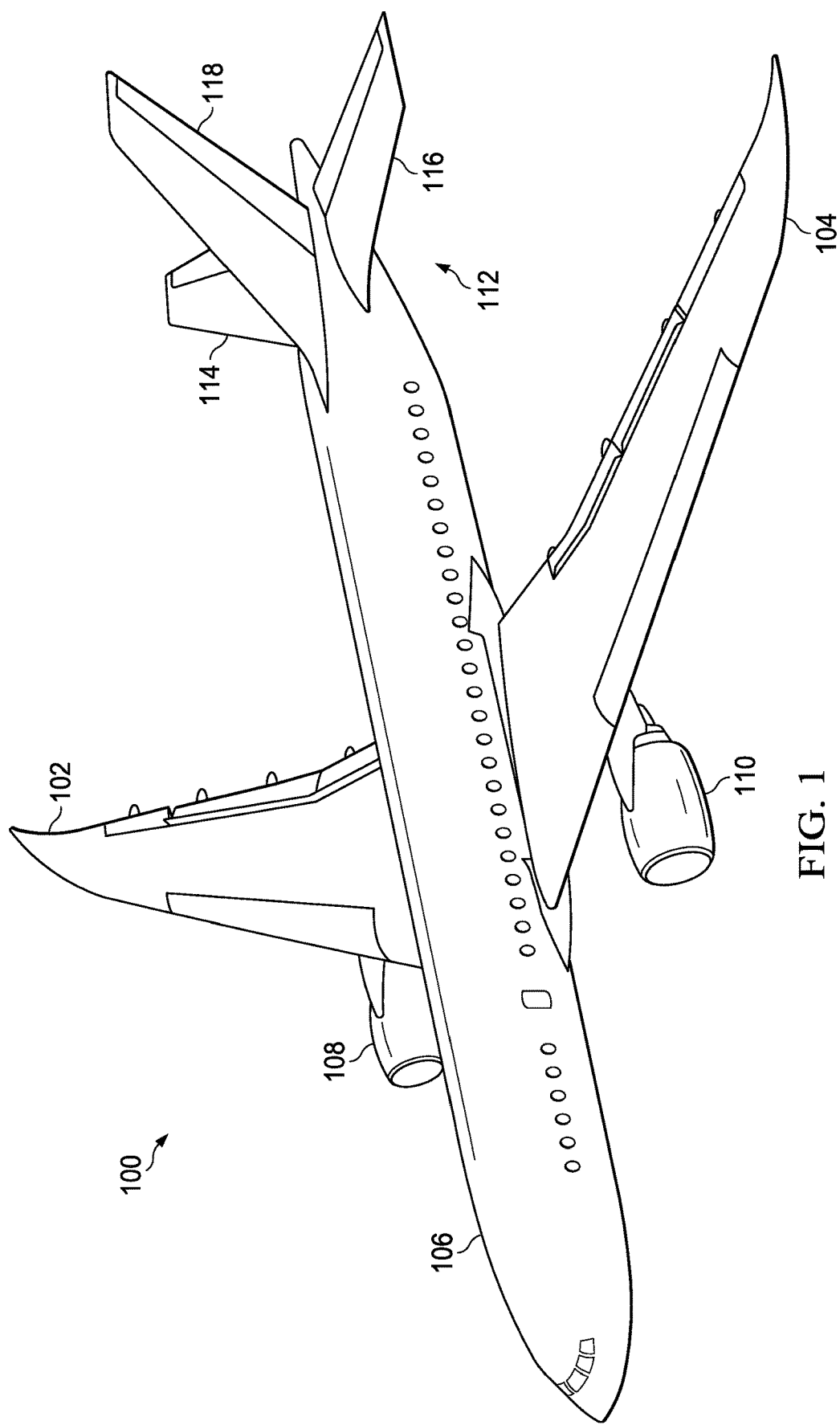
FIG. 1 is an illustration of an aircraft in which an illustrative embodiment may be implemented.

Turning now to FIG. 1, an illustration of an aircraft is depicted in accordance with an illustrative embodiment. Aircraft 100 has wing 102 and wing 104 attached to body 106. Aircraft 100 includes engine 108 attached to wing 102 and engine 110 attached to wing 104.

Body 106 has tail section 112. Horizontal stabilizer 114, horizontal stabilizer 116, and vertical stabilizer 118 are attached to tail section 112 of body 106.

Aircraft 100 is an example of an aircraft in which components of the aircraft are designed or developed using the illustrative examples in accordance with an illustrative embodiment. For example, a portion of wing 102 or wing 104 could be designed or analyzed using the illustrative examples. As another example, components inside body 106 such as lavatories, storage, or other components could be designed or analyzed using the illustrative examples.

Figure 2:
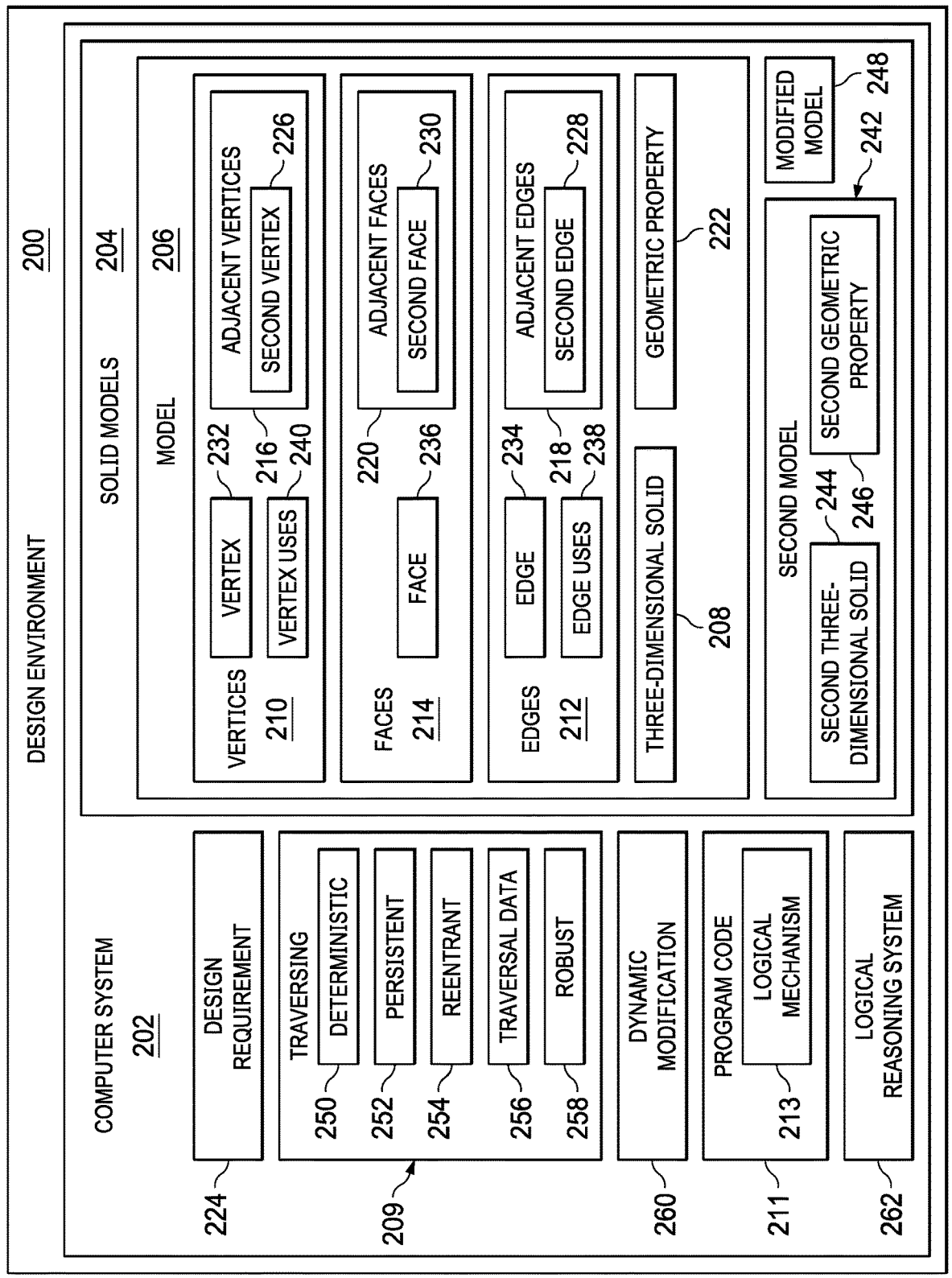
FIG. 2 is an illustration of a block diagram of a design environment in which an illustrative embodiment may be implemented.

Turning now to FIG. 2, an illustration of a block diagram of a design environment is depicted in which an illustrative embodiment may be implemented. Design environment 200 includes computer system 202 that performs methods for designing solid models 204. Model 206 of three-dimensional solid 208 is one of solid models 204. Computer system 202 performs traversing 209 of model 206 to perform analysis of model 206. Traversing 209 is configured to be performed on model 206 independent of whether model 206 is a manifold solid or a non-manifold solid.

Traversing 209 of model 206 determines topological adjacencies for model 206. The topological adjacencies include V of E/E of V, V of F/F of V, V of S/S of V, E of F/F of E, E of S/S of E, F of S/S of F, wherein V is a vertex, E is an edge, F is a face, and S is a solid. To perform traversing 209, find first and find next are utilized.

Program code 211 for traversing 209 of solid models 204, such as model 206, utilizes logical mechanism 213. The basic mechanism for traversing 209 of model 206 is provided by logical mechanism 213. Logical mechanism 213 is further described and demonstrated in FIG. 3 and FIG. 4 in traversing respective solid models, solid model 300, and solid model 400.

Logical mechanism 213 includes first=dataelement.find_first_x( ); next=first.find_next_x( ) or next=first.find_next_x(dataelement). This is the underlying mechanism for implementing a backtracking search—without carrying around an iterator or any additional state.

For this traversal to be logically correct, the result must have each data element (such as a face, edge, or vertex) adjacent to the instance (vertex, face, or solid) returned once and only once—even in the presence of degenerate geometries, bridge edges, non-manifold conditions, etc. This traversal will operate for multiple solid modeling data representations, linear and non-linear, manifold and non-manifold. The order of traversal is not limited, as long as the above characteristic is preserved. There is no special geometric or topological significance to the ordering, either in selecting the first or in the ordering of each of the next elements in traversals. The order of traversal can be chosen to suit what is best supported in a particular data representation. The ordering in the traversal must return each element once and only once, and must be consistent across method/function calls. However, if changes are allowed during traversal, it is best that new elements are added at the beginning of the traversal. Adding new elements at the beginning of the traversal is intended to avoid infinite loops, stack, or heap overflows and eases debugging.

Model 206 includes vertices 210, edges 212, and faces 214. Each vertex of vertices 210 is a three-dimensional point. Each edge of edges 212 is bounded by two vertices of vertices 210, except in the non-linear, non-manifold case where an edge is adjacent to a single vertex at both ends. Each face of faces 214 is bounded by a plurality of edges in edges 212.

To perform an analysis, traversing 209 can be performed for each of the faces of vertices 210, faces of edges 212, edges of faces 214, vertices of faces 214, edges of vertices 210, and vertices of edges 212. Faces of vertices 210 is a subset of faces 214. Faces of edges 212 is a subset of faces 214. Edges of faces 214 is a subset of edges 212. Vertices of faces 214 is a subset of vertices 210. Edges of vertices 210 is a subset of vertices 210. Vertices of edges 212 is a subset of vertices 210.

To perform traversing 209, computer system 202 first receives model 206 of three-dimensional solid 208 and determines at least one of vertices 210, edges 212, and faces 214 for model 206. Computer system 202 then performs traversing 209 of at least one of vertices 210, edges 212, and faces 214 of model 206 to determine corresponding adjacent vertices 216, adjacent edges 218, or adjacent faces 220 for the at least one of vertices 210, edges 212, and faces 214 such that each of corresponding adjacent vertices 216, corresponding adjacent edges 218, or corresponding adjacent faces 220 are counted exactly once in traversing 209.

As one example of logical mechanism 213 for traversing 209, to perform traversal V of E of model 206, the following logic is used E->Eu->Vu->V and OtherEu->Vu->V unless both are equal. This logic uses edges 212, edge uses 238, vertices 210, and vertex uses 240. An edge use in edge uses 238 is a two manifold use of an edge, and corresponds to a pair of incident faces with respect to that edge. A vertex use in vertex uses 240 is a two manifold use of a vertex.

Model 206 has any desirable quantity of vertices in vertices 210. For discussion purposes, a limited quantity of vertices are depicted in vertices 210. For example, vertex 232 is one of vertices 210 of model 206. During traversing 209 of model 206, all edges of edges 212 associated with vertex 232 and all faces of faces 214 associated with vertex 232 will be returned only once.

In one illustrative example, vertex 232 is connected to second vertex 226 by edge 234. In this illustrative example, E of V for vertex 232 would include edge 234. In this illustrative example, V of E for edge 234 would include vertex 232 and second vertex 226.

In some illustrative examples, face 236 and second face 230 are joined at edge 234. In these illustrative examples, F of E for edge 234 would include face 236 and second face 230.

In some illustrative examples, edge 234 and second edge 228 form parts of face 236. In these illustrative examples, E of F for face 236 would include edge 234 and second edge 228.

Computer system 202 determines geometric property 222 of model 206 based on the at least one of vertices 210, edges 212, and faces 214 of model 206 and the corresponding adjacent vertices 216, adjacent edges 218, or adjacent faces 220 for the at least one of vertices 210, edges 212, and faces 214. Geometric properties, such as geometric property 222, are mathematical equations that describe where in a three-dimensional space model components are present. Geometric property 222 can include information about face geometry, edge geometry, vertex geometry, or transformations. For example, three-dimensional coordinates of a vertex, parametric equation of a curve that passes through an edge, a parametric equation of a surface that passes through a face that define the boundary of the set of points of a solid.

Computer system 202 determines whether model 206 satisfies design requirement 224 based on geometric property 222. In some illustrative examples, design requirement 224 comprises one of a relationship between the at least one of vertices 210, edges 212, and faces 214 of model 206 and second vertex 226, second edge 228, or second face 230 of model 206 and a relationship between the at least one of vertices 210, edges 212, and faces 214 of model 206 and second model 242 of second three-dimensional solid 244.

Computer system 202 can be utilized to perform traversing 209 on any desirable model of solid models 204. Computer system 202 can be utilized to perform analysis and traversing 209 on a family of models or series of models. For example, computer system 202 can determine second geometric property 246 of second model 242 of second three-dimensional solid 244. Computer system 202 determines a relationship between geometric property 222 and second geometric property 246.

Computer system 202 is used to create designs, analyze designs, and change designs for products. Computer system 202 is capable of analyzing solid models 204 and modifying solid models 204 as necessary to meet design principles or design requirements, such as design requirement 224. In some illustrative examples, responsive to a determination that model 206 of three-dimensional solid 208 does not satisfy design requirement 224, computer system 202 modifies model 206 to generate modified model 248 that satisfies design requirement 224. By computer system 202 modifying model 206, at least one of operator time and operator cost is reduced.

In computer system 202 using logical mechanism 213, the results of traversing 209 are deterministic 250 and persistent 252. Deterministic is used in the sense of a deterministic algorithm. When traversing 209 is deterministic 250, a same query will result in the same result in the same order. Additionally, traversal results do not change if multiple traversals are interleaved. For example, traversal results do not change from a traversal of edges of a face to determine proximity to traversal results performed concurrently with the same edges of the same face to determine adjacency to another face. Using logical mechanism 213, traversing 209 is reentrant 254, allowing multiple simultaneous traversals over a same model.

In some illustrative examples, using logical mechanism 213 results in traversal data 256 not being stored in geometric data structures. By not storing traversal data 256, computing resources are reduced for traversing 209 in contrast to analysis provided by commercially available CAD programs.

By utilizing logical mechanism 213, traversing 209 is robust 258 during dynamic modification 260 of model 206, such that the method of traversing 209 is tolerant of additions, modifications, and removals of model elements during dynamic modification 260 to model 206. When traversing 209 is robust 258, modifications to a solid model, such as model 206, will have minimal or no effect on the success of the traversal. For example, when traversing 209 is robust 258, the addition or modification of an element is done in a way that avoids an infinite loop in the traversal, and the removal of an element will not cause the traversal to fail.

Implementation of logical mechanism 213 in program code 211 on computer system 202 transforms computer system 202 to logical reasoning system 262. Logical reasoning system 262 is capable of designing solid models 204 that meet design requirement 224. Logical reasoning system 262 is capable of analyzing solid models 204 to determine whether solid models 204 meet design requirements, such as design requirement 224.

Logical reasoning system 262 reduces the cost associated with designing products. Logical reasoning system 262 provides for the production of designs within at least one of a desirable cost or a desirable schedule. Logical reasoning system 262 can result in less error than designing by hand or migrating designs between software and systems. Logical reasoning system 262 allows for closing development business cases. The automated reasoning capabilities of Logical reasoning system 262 provides the capability for designing complex systems more quickly than with conventional methods and systems.

Figure 3:
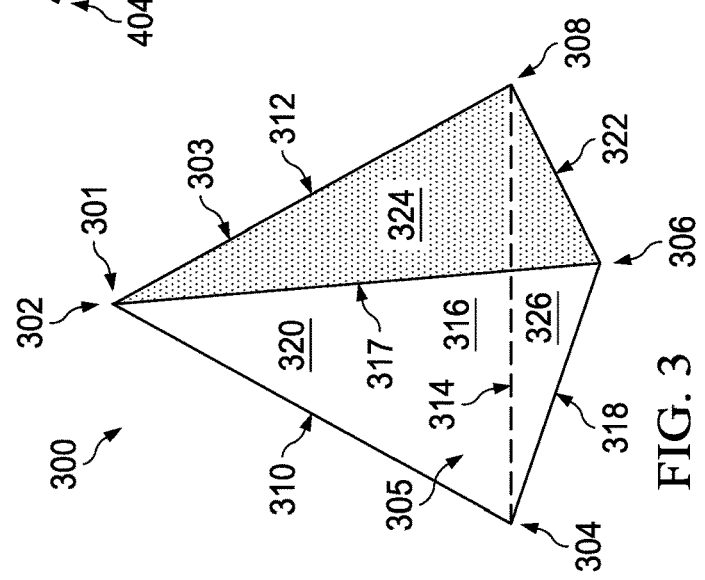
FIG. 3 is an illustration of a solid model in accordance with an illustrative embodiment.

Turning now to FIG. 3, an illustration of a solid model is depicted in accordance with an illustrative embodiment. Solid model 300 is a physical implementation of model 206. Solid model 300 is a manifold solid. A manifold solid is a solid where every place on the surface is two-dimensional. In this illustrative example, solid model 300 comprises a tetrahedron. Solid model 300 has vertices 301, edges 303, and faces 305.

Vertices 301 are all of the vertices of solid model 300 and are described as V of S. Vertices 301 include vertex 302, vertex 304, vertex 306, and vertex 308. Edges 303 are all edges of solid model 300 and are described as E of S. Edges 303 include edge 310, edge 312, edge 314, edge 317, edge 318, and edge 322. Faces 305 are all of the faces of solid model 300 and are described as F of S. Faces 305 include face 316, face 320, face 324, and face 326.

Solid model 300 can be traversed using logical mechanism 213 of FIG. 2. Logical mechanism 213 includes first=dataelement.find_first_x( ); next=first.find_next_x( ) or next=first.find_next_x(dataelement). This is the underlying mechanism for implementing a backtracking search without carrying around an iterator or any additional state.

Vertices 301 include vertex 302, vertex 304, vertex 306, and vertex 308. Edge 310 terminates at vertex 302 and vertex 304. Edge 312 terminates at vertex 302 and vertex 308. Edge 314 terminates at vertex 304 and vertex 308. Face 316 is bordered by edge 310, edge 312, and edge 314.

In topological adjacencies, vertex 302 and vertex 304 may be described as V of E for edge 310. In topological adjacencies, edge 310, edge 312, and edge 317 are described as E of V for vertex 302. In topological adjacencies, edge 310, edge 314, and edge 318 are described as E of V for vertex 304.

Edge 317 terminates at vertex 302 and vertex 306. Edge 318 terminates at vertex 304 and vertex 306. Face 320 is bordered by edge 310, edge 317, and edge 318.

In topological adjacencies, vertex 302 and vertex 306 may be described as V of E for edge 317. In topological adjacencies, edge 317, edge 318, and edge 322 are described as E of V for vertex 306.

Edge 322 terminates at vertex 306 and vertex 308. Face 324 is bordered by edge 312, edge 317, and edge 322. Face 326 is bordered by edge 314, edge 318, and edge 322.

In topological adjacencies, vertex 302 and vertex 308 may be described as V of E for edge 312. In topological adjacencies, edge 312, edge 314, and edge 322 are described as E of V for vertex 308.

To perform vertex traversals using logical mechanism 213 of FIG. 2, vertices of each edge (V of E) are traversed. To perform vertex traversals using logical mechanism 213 of FIG. 2, the following method is performed: first return E->Eu->Vu->V, and then return E->Eu->OtherEu->Vu->V, except in the non-manifold case where the edge has the same vertex at both ends and therefore the condition E->Eu->Vu->V==E->Eu->OtherEu->Vu->V is satisfied. An example of this non-manifold case is illustrated by edge 526 and vertex 534 in FIG. 5. Traversal method E.find_first_vertex( ) returns the first vertex. The V.find_next_vertex(E) method resumes the traversal and returns the second vertex.

Performing vertex traversals using this method correctly accounts for non-manifold edges that loop onto themselves. An edge that loops onto itself is an edge has the same vertex at both ends.

An edge use, denoted Eu, is a two manifold use of an edge, and corresponds to a pair of incident faces with respect to that edge. Any edge on a two manifold surface will have a single pair of incident faces, thus a single edge use. In this illustrative example, each edge of edges 303 has a single edge use. In contrast, at least one edge of edges 403 in FIG. 4 will have multiple edge uses.

A vertex use, denoted Vu, is a two manifold use of a vertex. This is a use of a vertex with respect to a shell. Any vertex on a two manifold surface will have a single vertex use. In this illustrative example, each vertex of edges 303 has a single edge use. In contrast, at least one edge of edges 403 in FIG. 4 will have multiple edge uses.

In topological adjacencies, vertex 302, vertex 304, and vertex 308 are described as V of F for face 316. In topological adjacencies, face 316, face 320, and face 324 are described as F of V for vertex 302. In topological adjacencies, face 316, face 320, and face 326 are described as F of V for vertex 304. In topological adjacencies, face 320, face 324, and face 326 are described as F of V for vertex 306. In topological adjacencies, face 316, face 324, and face 326 are described as F of V for vertex 308.

In topological adjacencies, vertex 302, vertex 304, and vertex 306 are described as V of F for face 320. In topological adjacencies, vertex 302, vertex 306, and vertex 308 are described as V of F for face 324. In topological adjacencies, vertex 304, vertex 306, and vertex 308 are described as V of F for face 326.

To perform vertex traversals using logical mechanism 213 of FIG. 2, vertices of each face (V of F) are traversed. To perform vertex traversals using logical mechanism 213 of FIG. 2, the following method is performed: F->L->Eu->Vu->V.isFirstUseOfVertexOnFace(F) and F->L->Vu->V.isFirstUseOfVertexOnFace(F). In this logic, F is a face, L is a face loop that is a boundary on a face, Eu is an edge use, Vu is a vertex use, and V is a vertex. The traversal method loops through each face loop of the face, and each edge use of the face loop, each vertex use of the edge use, each vertex use of the face loop, and each vertex of the vertex use. Performing this F.find_first_vertex( ) method returns a first use of V on F. The V.find_next_vertex(F) resets the loop invariants and resumes the traversal, returning the next and subsequent vertices of V on F. The isFirstUseOfVertexOnFace method is determined by satisfying the condition V->Vu->Eu->L->F==F or V->Vu->L->F==F.

The method returns topological elements that satisfy the logical conditions as it walks through. This method does not double count elements. Unlike conventional programs, this method does not require deletion of duplicate instances of elements from a spreadsheet or other data storage.

To perform vertex traversals using logical mechanism 213 of FIG. 2, vertices of each solid (V of S) are traversed. To perform vertex traversals using logical mechanism 213 of FIG. 2, the following method is performed: S->Sh->Shu->F->L->Eu->Vu->V if Vu==Vu->V->Vu. In this logic, S is a solid, Sh is a shell, and Shu is a shell use. The solid includes all edges, vertices, and faces. The traversal method loops through each shell of the solid, each shell use of the shell, each face of the shell use, each face loop of the face, each edge use of the face loop, each vertex use of the edge use, each vertex use of the face loop, and each vertex of the vertex use. Performing the S.find_first_vertex( ) method returns a first use of V on S. The V.find_next_vertex(S)

resets the loop invariants and resumes the traversal, returning the next and subsequent vertices of V on S.

A shell use, denoted Shu, is a two manifold piece of a connected surface. Shell uses of a surface can be separated by splitting apart the vertices and edges with non-manifold neighborhoods. A shell use is a partition of the faces, edge uses, and vertex uses of a shell (surface) such that one can traverse from any face, edge use, or vertex use of that partition to any other by their adjacencies without crossing any faces, edge uses, or vertex uses of any other partition. A two manifold shell will have a single shell use, and a two manifold solid will have an equal number of shells and shell uses. A non-manifold solid may have more shell uses than shells.

The method will only return the first use of V, i.e., when the condition Vu==Vu->V->Vu is satisfied. By performing this method, the returned vertices are unique on a solid for both manifold and non-manifold solids.

To perform edge traversals using logical mechanism 213 of FIG. 2, edges of each vertex (E of V) are traversed. To perform edge traversals using logical mechanism 213 of FIG. 2, the following method is performed: loop through the vertex uses of the vertex V->Vu and loop through edge uses adjacent to the vertex use Vu->Eu and Eu->CcwEu->OtherEu, returning the edge E of the edge use Eu that satisfies Eu.isFirstUseOfEdgeByVertex(V). Performing the V.find_first_edge( ) method returns a first use of E on V. The E.find_next_edge(V) resets the loop invariants and resumes the traversal, returning the next and subsequent edges E on V. During this method, the computer system "walks" around the edges of the vertex uses Vu and edge uses Eu of the vertex V. This logic is designed to return only the first use of the edge by the vertex, which provides correct results with both manifold and non-manifold cases. The isFirstUseOfEdgeByVertex method checks if logical condition Eu==Eu->E.findFirstUseOfEdgeByVertex(V) is satisfied, and where methods findFirstUseOfEdgeByVertex loops through the edge uses of the edge E->Eu and Eu->OtherEu returning the first edge use adjacent to the given vertex V and the logical condition Eu->Vu->V==V is satisfied.

As used herein, Ccw stands for counterclockwise. CcwEu describes a counterclockwise edge use that is a relationship between the elements in graph connectivity.

To perform edge traversals using logical mechanism 213 of FIG. 2, edges of each face (E of F) are traversed. To perform edge traversals using logical mechanism 213 of FIG. 2, the following method is performed: F->L->Eu->E. The traversal method loops through each face loop of the face, each edge use of the face loop L->Eu and the edge of the edge use Eu->E. Performing the F.find_first_edge( ) method returns a first use of E on F. The E.find_next_edge (F) resets the loop invariants and resumes the traversal, returning the next and subsequent edges of E on F. The method is designed to return only the first use of the edge by the face by satisfying the logical condition Eu->E->findFirstEhUseOfEdgeByFace(F)==Eu. If this condition is satisfied, the traversal returns the edge of the edge use. The findFirstEhUseOfEdgeByFace method is determined by looping through the edge uses of the edge and returning the first edge use that satisfies the condition Eu->L->F==F. This method avoids double counting of non-manifold edges such as edge 526 of face 506 in FIG. 5.

In topological adjacencies, edge 310, edge 312, and edge 314 are described as E of F for face 316. In topological adjacencies, edge 310, edge 317, and edge 318 are described as E of F for face 320. In topological adjacencies, edge 312, edge 317, and edge 322 are described as E of F for face 324.

In topological adjacencies, edge 314, edge 318, and edge 322 are described as E of F for face 326.

To perform edge traversals using logical mechanism 213 of FIG. 2, edges of the solid (E of S) are traversed. To perform edge traversals using logical mechanism 213 of FIG. 2, the following method is performed: S-Sh-Shu->F->L->Eu->E. The traversal method loops through each shell of the solid, each shell use of the shell, each face of the shell use, each face loop of the face, each edge use of the face loop, and the edge of the edge use. Performing the S.find_first_edge( ) method returns a first use of E on S. The E.find_next_edge(S) resets the loop invariants and resumes the traversal, returning the next and subsequent edges of E on S. The method is designed to return only the first use of the edge by the solid by satisfying the logical condition Eu=Eu->E->Eu.

To perform face traversals using logical mechanism 213 of FIG. 2, faces of each vertex (F of V) are traversed. To perform face traversals using logical mechanism 213 of FIG. 2, the following method is performed: V->Vu->Eu->L->F, Eu->OtherEu->CcwEu->L->F, and V->Vu->L->F. Performing the V.find_first_face( ) method returns a first use of F of V. The F.find_next_face(V) resets the loop invariants and resumes the traversal, returning the next and subsequent faces F of V. Loop through the vertex uses of the vertex V->Vu, the edge uses of the vertex uses, the face of the face loops of the edge uses, and face of the face loops of the vertex uses (where a face loop contains only one vertex use). Break the loop and return the face of the edge use when the logical condition Eu.isFirstUseOfFaceOnVertex( ) is satisfied, or when Vu->L.isFirstUseOfFaceOVertex( ) is satisfied. The Eu.isFirstUseOfFaceOnVertex( ) is satisfied when logical condition Eu==Eu->L->F.findFirstEdgeUseOfFaceOnVertex(Eu->Vu->V) is satisfied, where F.findFirstEdgeUseOfFaceOnVertex(V) returns the first edge use of the edge use's face adjacent to the given vertex.

To traverse the faces that are adjacent to a single vertex v1 of a tetrahedron, the logic is f1=v1.find_first_face( ); f2=f1.find_next_face(v1); f3=f2.find_next_face(v1); f4=f3.find_next_face(v1)==null. In this illustrative example, if v1 is vertex 302, for f1=v1.find_first_face( ), f1=face 316. In this illustrative example, if v1 is vertex 302, for f2=f1.find_next_face(v1), f2=face 320. In this illustrative example, if v1 is vertex 302, for f3=f2.find_next_face (v1), f3=face 324. In this illustrative example, if v1 is vertex 302, f4=f3.find_next_face(v1)==null.

An alternate formulation is f1=v1.find_first(Face); f2=f1.find_next(v1) or f1=find_first(v1, Face); f2=find_next (f1, v1). The result of this traversal has each face adjacent to the vertex returned once and only once—even in the presence of degenerate geometries, bridge edges, non-manifold conditions, etc.

Similarly, it is desired to traverse the faces of edges, edges of faces, vertices of faces, edges of vertices, and vertices of edges as described above and below. Similar logic statements including "find_first" and "find_next" can be written for each of traversing the faces of edges, edges of faces, vertices of faces, edges of vertices, and vertices of edges.

To perform face traversals using logical mechanism 213 of FIG. 2, faces of each edge (F of E) are traversed. Performing the E.find_first_face( ) method returns a first use of F of E. The F.find_next_face(E) resets the loop invariants and resumes the traversal, returning the next and subsequent faces F of E. The method loops through the edge uses of the edge, the face loops of the edge uses, and returns the faces of the face loops that in the traversal order, specifically E->Eu->L->F to find the first face. For subsequent faces, find the first edge use of the edge E on the face F, then traverse to the next edge use Eu->OtherEu of the edge, check if the logical condition Eu==E.findFirstEdgeUseOfEdgeByFace(Eu->L->F) is satisfied, and if it is return Eu->L->F. If the logical condition continue looping through the remainder of the edge uses of the edge. The method E.findFirstEdgeUseOfEdgeByFace(F) loops through the edge uses of the edge and returns the first edge use adjacent to the given face F.

In topological adjacencies, face 316 and face 320 are described as F of E for edge 310. In topological adjacencies, face 316 and face 324 are described as F of E for edge 312. In topological adjacencies, face 316 and face 326 are described as F of E for edge 314. In topological adjacencies, face 320 and face 324 are described as F of E for edge 317. In topological adjacencies, face 320 and face 326 are described as F of E for edge 318. In topological adjacencies, face 324 and face 326 are described as F of E for edge 322.

To perform face traversals using logical mechanism 213 of FIG. 2, faces of the solid (F of S) are traversed. To perform face traversals using logical mechanism 213 of FIG. 2, the following method is performed: S-Sh-Shu->F, F->nextF, F->Shu->nextShu->F, F->Shu->Sh->nextSh->Shu->F, etc. The traversal method loops through each shell of the solid, each shell use of the shell, and each face of the shell use. Performing the S.find_first_face( ) method returns a first use of F on S. The F.find_next_face(S) resets the loop invariants and resumes the traversal, returning the next and subsequent faces F on S. In this method, the returned faces are unique on a solid.

Figure 4:
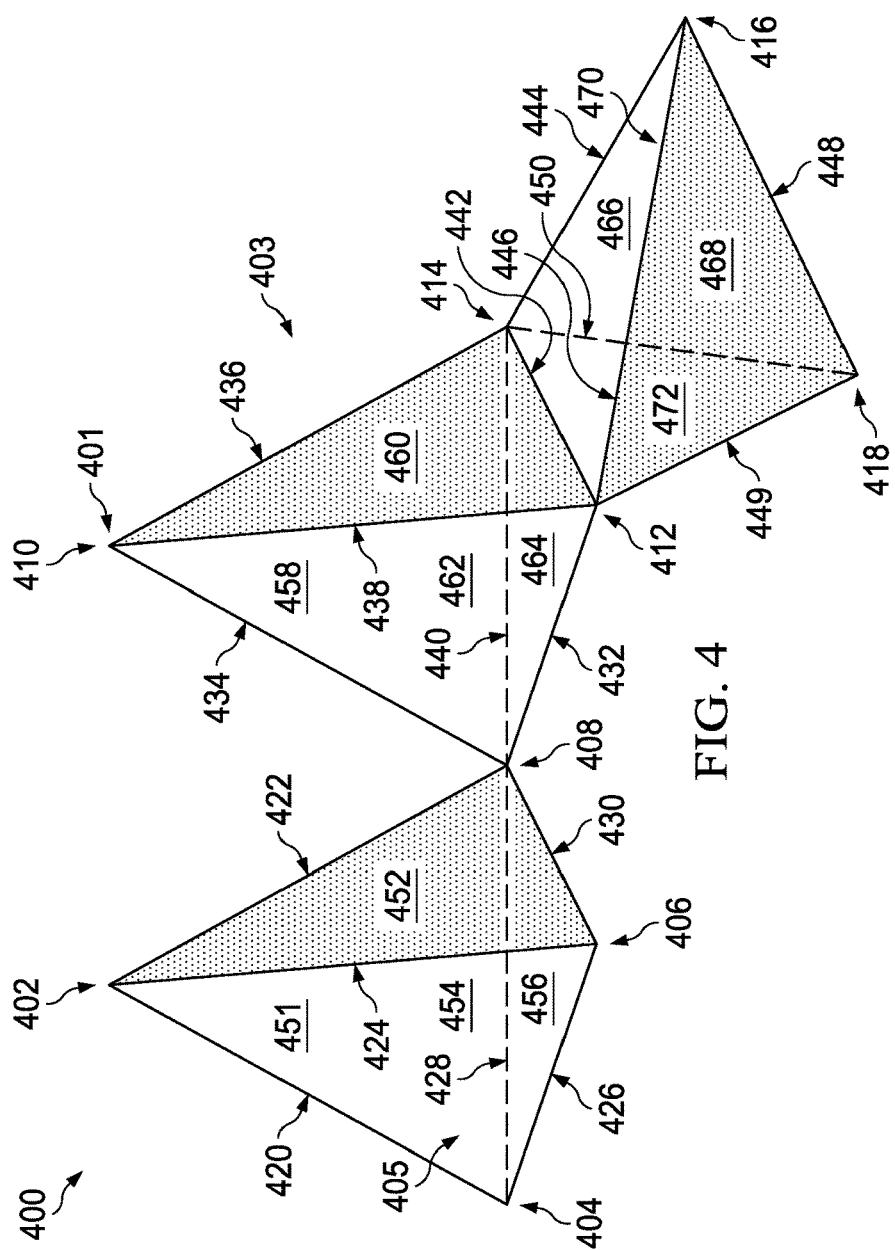
FIG. 4 is another illustration of a solid model in accordance with an illustrative embodiment.

Turning now to FIG. 4, an illustration of a solid model is depicted in accordance with an illustrative embodiment. Solid model 400 is a physical implementation of model 206. Solid model 400 comprises a nonmanifold solid. A non-manifold solid will have points that are not two-dimensional. For example, points that have two or more portions of the surface that touch at an edge or a vertex. Solid model 300 of FIG. 3 is a manifold solid while solid model 400 is a non-manifold solid.

Solid model 400 can be traversed using logical mechanism 213 of FIG. 2. Logical mechanism 213 includes first=dataelement.find_first_x( ); next=first.find_next_x( ) or next=first.find_next_x(dataelement). This is the underlying mechanism for implementing a backtracking search without carrying around an iterator or any additional state.

Solid model 400 has vertices 401, edges 403, and faces 405. Vertices 401 include vertex 402, vertex 404, vertex 406, vertex 408, vertex 410, vertex 412, vertex 414, vertex 416, and vertex 418. Edges 403 include edge 420, edge 422, edge 424, edge 426, edge 428, edge 430, edge 432, edge 434, edge 436, edge 438, edge 440, edge 442, edge 444, edge 446, edge 448, edge 449, and edge 450. Faces 405 include face 451, face 452, face 454, face 456, face 458, face 460, face 462, face 464, face 466, face 468, face 470, and face 472.

Although the geometry of solid model 400 is more complicated than that of solid model 300, the same logical analysis is performed on solid model 400 to perform traversals of faces of vertices, vertices of faces, faces of edges, edges of faces, edges of vertices, and vertices of edges. Using each of the traversals, the method determines the vertices, edges, and faces of the solid, solid model 400.

For example, in performing a traversal of the edges of vertices, edge 428, edge 430, edge 422, edge 434, edge 432, and edge 440 are all E of V for vertex 408. Vertex 408 is a non-manifold condition. As another example, in performing traversal of the faces of edges, face 460, face 464, face 466, and face 472 are each F of E for non-manifold edge, edge 442.

The traversals supporting the logical mechanism described above are deterministic and persistent by design. For example, in a query for an edge of vertex 412, the (low level) traversal would return the first edge of vertex 412, edge 432. The query would always return the same first edge, edge 432. In the traversal, the next edge of vertex 412 after 432 is sought. Again the next returned edge it would always be the same next edge. The traversal repeatedly queries for the next edge, getting edge 432, edge 438, edge 442, edge 449, and edge 446, and then no more. Performing this traversal, returns the same result in the same order, deterministically, when the same query is made.

The logical mechanism uses this first, next traversal in the backtracking search, and could be used to satisfy a design condition. For example, one could search for an edge of vertex 412 that is adjacent to both face 460 and face 466. Only edge 442 would satisfy that condition.

Solid model 400 is a non-manifold solid and has more vertex uses and edge uses than solid model 300. For example, the three non-manifold vertices of solid model 400, vertex 408, vertex 412, and vertex 414, each have two vertex uses. As another example, the non-manifold edge, edge 442, of solid model 400 has two edge uses.

The non-manifold solid, solid model 400, can be divided into three shell uses. To separate solid model 400 into shell uses, solid model 400 would be separated at vertex 408, vertex 412, and vertex 414 to form three tetrahedrons.

Figure 5:
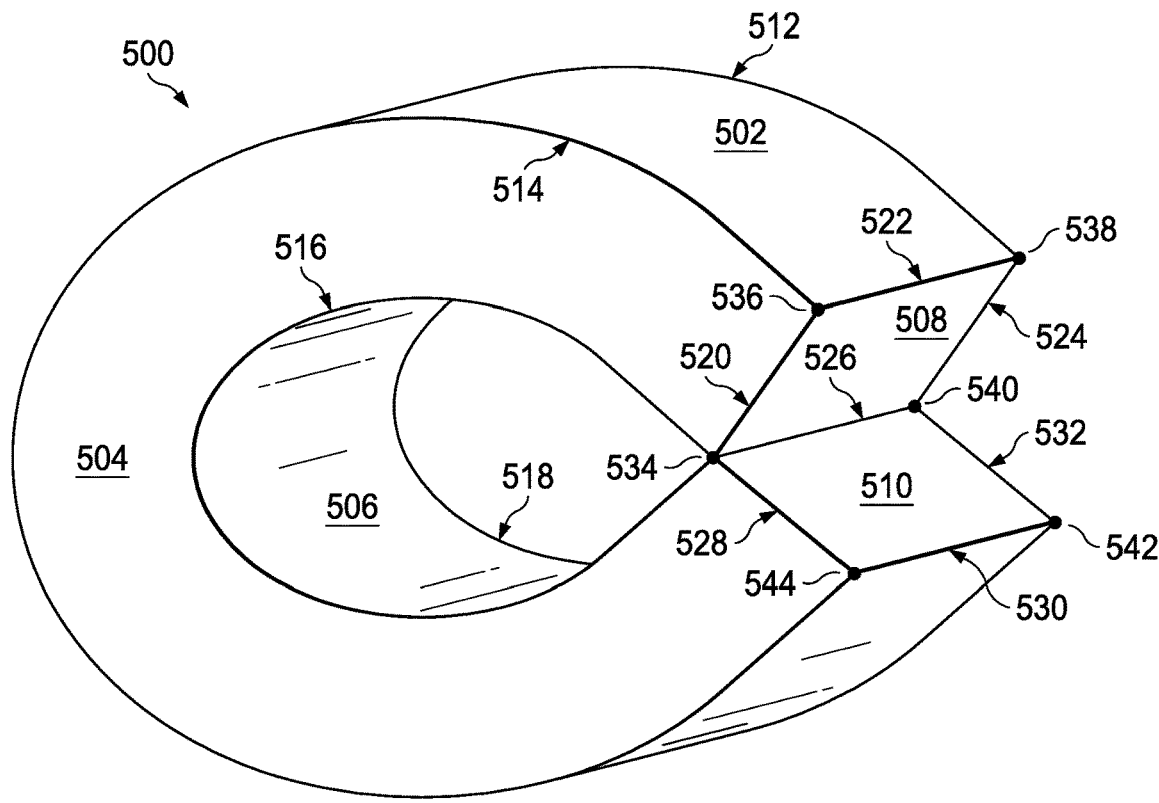
FIG. 5 is another illustration of a solid model in accordance with an illustrative embodiment.

Turning now to FIG. 5, an illustration of a solid model is depicted in accordance with an illustrative embodiment. Solid model 500 is a physical implementation of model 206. Solid model 500 comprises a non-manifold solid. A non-manifold solid will have points that are not two-dimensional. For example, points that have two or more portions of the surface that touch at an edge or a vertex.

Solid model 500 can be traversed using logical mechanism 213 of FIG. 2. Logical mechanism 213 includes first=dataelement.find_first_x( ); next=first.find_next_x( ) or next=first.find_next_x(dataelement). This is the underlying mechanism for implementing a backtracking search without carrying around an iterator or any additional state.

Solid model 500 has vertices, edges, and faces. The faces of solid model 500 include face 502, face 504, face 506, face 508, face 510, and a face opposite face 504 that is not visible in FIG. 5. The edges of solid model 500 include edge 512, edge 514, edge 516, edge 518, edge 520, edge 522, edge 524, edge 526, edge 528, edge 530, and edge 532. The vertices of solid model 500 include vertex 534, vertex 536, vertex 538, vertex 540, vertex 542, and vertex 544.

Although the geometry of solid model 500 is more complicated than that of solid model 300, the same logical analysis is performed on solid model 500 to perform traversals of faces of vertices, vertices of faces, faces of edges, edges of faces, edges of vertices, and vertices of edges. Using each of the traversals, the method determines the vertices, edges, and faces of the solid, solid model 500.

For example, in performing a traversal of the edges of vertices, edge 516, edge 520, and edge 528 are all E of V for vertex 534. In performing a traversal of the edges of vertices without logical mechanism 213, edge 516 could be returned twice for vertex 534. However, to perform vertex traversals using logical mechanism 213 of FIG. 2, the following method is performed: E->Eu->Vu->V and OtherEu->Vu->V unless both are equal. Performing vertex traversals using this method avoids edges that loop onto themselves. By designating "unless both are equal," in logical mechanism 213, edge 516 is not counted twice in a traversal of solid model 500.

As another example, in performing a traversal of the edges of vertices, edge 518, edge 524, and edge 532 are all E of V for vertex 540. In performing a traversal of the edges of vertices without logical mechanism 213, edge 518 could be returned twice for vertex 540. By designating "unless both are equal," in logical mechanism 213, edge 518 is not counted twice in a traversal of solid model 500.

To perform face traversals using logical mechanism 213 of FIG. 2, faces of each edge (F of E) are traversed. In performing a traversal of the faces of edges, face 506, face 508, and face 510 are all F of E for edge 526. In performing a traversal of the faces of edges without logical mechanism 213, face 506 could be returned twice for edge 526. However, to perform face traversals using logical mechanism 213 of FIG. 2, face 506 is not counted twice in a traversal of solid model 500.

Solid model 500 has one shell and one shell use. To separate solid model 500 into shell uses, solid model 500 would be separated at edge 526.

Figure 6:
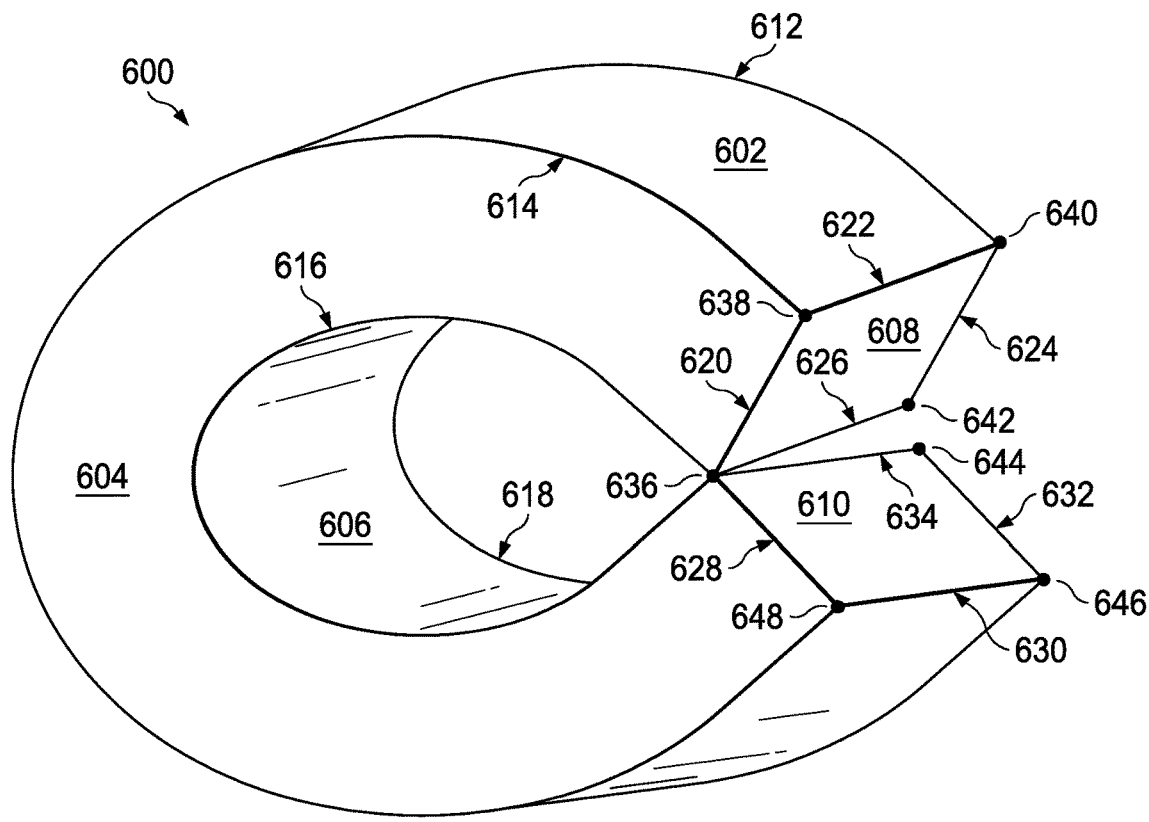
FIG. 6 is another illustration of a solid model in accordance with an illustrative embodiment.

Turning now to FIG. 6, an illustration of a solid model is depicted in accordance with an illustrative embodiment. Solid model 600 is a physical implementation of model 206. Solid model 600 comprises a non-manifold solid.

Solid model 600 can be traversed using logical mechanism 213 of FIG. 2. Logical mechanism 213 includes first=dataelement.find_first_x( ); next=first.find_next_x( ) or next=first.find_next_x(dataelement). This is the underlying mechanism for implementing a backtracking search without carrying around an iterator or any additional state.

Solid model 600 has vertices, edges, and faces. The faces of solid model 600 include face 602, face 604, face 606, face 608, face 610, and a face opposite face 604 that is not visible in FIG. 6. The edges of solid model 600 include edge 612, edge 614, edge 616, edge 618, edge 620, edge 622, edge 624, edge 626, edge 628, edge 630, edge 632, and edge 634. The vertices of solid model 600 include vertex 636, vertex 638, vertex 640, vertex 642, vertex 644, vertex 646, and vertex 648.

For example, in performing a traversal of the edges of vertices, edge 616, edge 620, and edge 628 are all E of V for vertex 636. In performing a traversal of the edges of vertices without logical mechanism 213, edge 616 could be returned twice for vertex 636. However, to perform vertex traversals using logical mechanism 213 of FIG. 2, the following method is performed: E->Eu->Vu->V and OtherEu->Vu->V unless both are equal. Performing vertex traversals using this method avoids edges that loop onto themselves. By designating "unless both are equal," in logical mechanism 213, edge 616 is not counted twice in a traversal of solid model 600.

Solid model 600 has one shell and one shell use. To separate solid model 600 into shell uses, solid model 600 would be separated at vertex 636.

Figure 7:
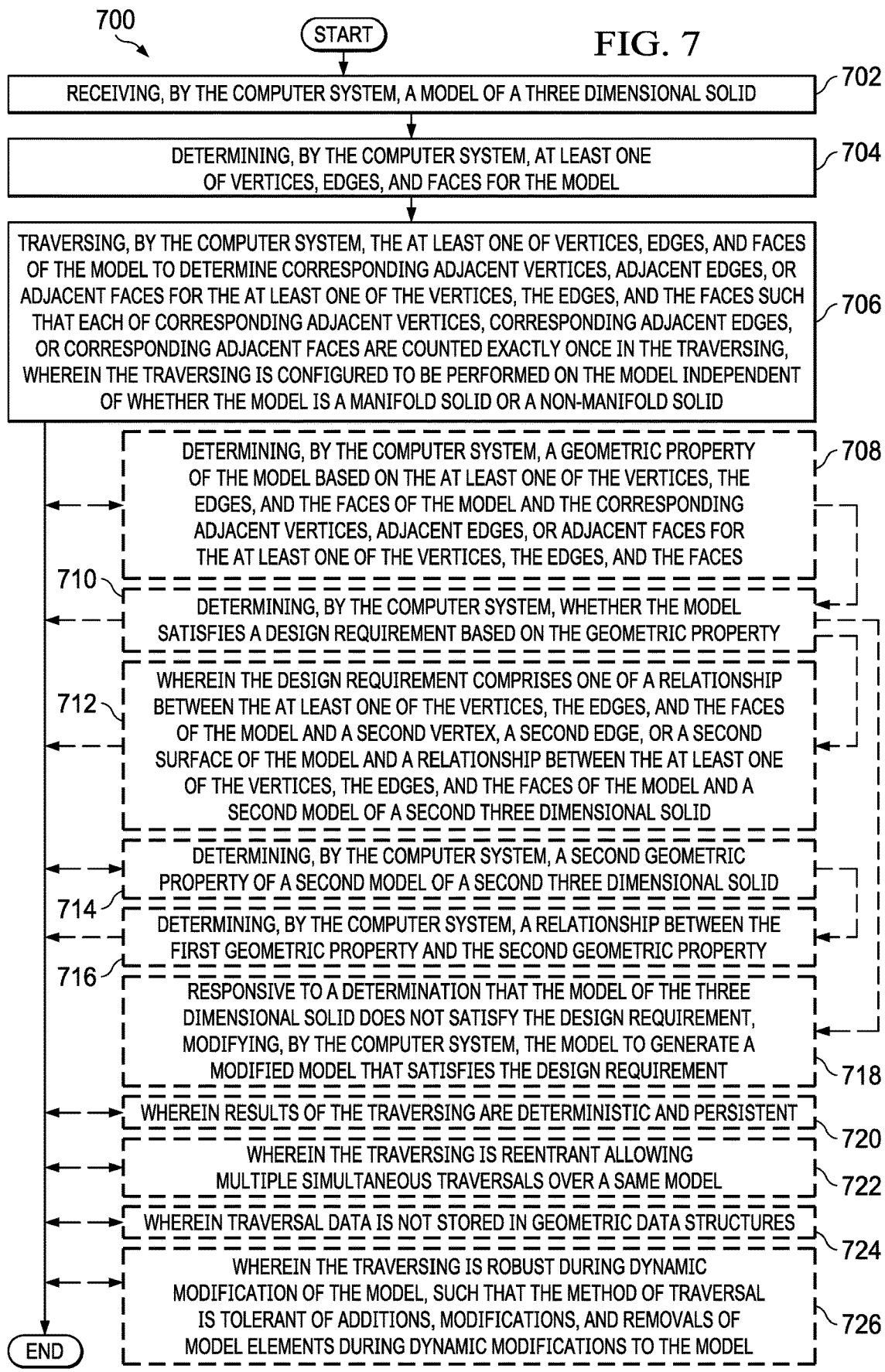
FIG. 7 is an illustration of a flowchart of a computer-implemented method of designing solid models in accordance with an illustrative embodiment.

Turning now to FIG. 7, an illustration of a flowchart of a computer-implemented method of designing solid models is depicted in accordance with an illustrative embodiment. Method 700 can be used to design or analyze a component of aircraft 100. Method 700 can be implemented in computer system 202 of FIG. 2. Method 700 can be used in designing solid model 300 of FIG. 3. Method 700 can be used in designing solid model 400 of FIG. 4. Method 700 can be used in designing solid model 500 of FIG. 5. Method 700 can be used in designing solid model 600 of FIG. 6.

Method 700 receives, by the computer system, a model of a three-dimensional solid (operation 702). The three-dimensional solid can be a manifold solid or a non-manifold solid. The type of product represented by the three-dimensional solid is not limited in this illustrative example.

Method 700 determines, by the computer system, at least one of vertices, edges, and faces for the model (operation 704). Method 700 traverses, by the computer system, the at least one of vertices, edges, and faces of the model to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traversing, wherein the traversing is configured to be performed on the model independent of whether the model is a manifold solid or a non-manifold solid (operation 706). Afterward, method 700 terminates.

In some illustrative examples, method 700 determines, by the computer system, a geometric property of the model based on the at least one of the vertices, the edges, and the faces of the model and the corresponding adjacent vertices, adjacent edges, or adjacent faces for the at least one of the vertices, the edges, and the faces (operation 708). A geometric property includes mathematical equations that describe where in a three-dimensional space components of the model are present.

In some illustrative examples, method 700 determines, by the computer system, whether the model satisfies a design requirement based on the geometric property (operation 710). In some illustrative examples, the design requirement comprises one of a relationship between the at least one of the vertices, the edges, and the faces of the model and a second vertex, a second edge, or a second face of the model and a relationship between the at least one of the vertices, the edges, and the faces of the model and a second model of a second three dimensional solid (operation 712).

In some illustrative examples, the geometric property comprises a first geometric property and method 700 determines, by the computer system, a second geometric property of a second model of a second three-dimensional solid (operation 714). In some illustrative examples, method 700 determines, by the computer system, a relationship between the first geometric property and the second geometric property (operation 716).

In some illustrative examples, method 700, responsive to a determination that the model of the three-dimensional solid does not satisfy the design requirement, modifies, by the computer system, the model to generate a modified model that satisfies the design requirement (operation 718).

In method 700, the results of the traversing are deterministic and persistent (operation 720). In method 700, the traversing is reentrant allowing multiple simultaneous traversals over a same model (operation 722).

In some illustrative examples, traversal data is not stored in geometric data structures (operation 724). By not saving traversal data in the geometric data structures, the illustrative examples greatly reduce the computing requirements in contrast to other geometric analysis. By not saving the traversal data in the geometric data structures, the illustrative examples may have reduced computing requirements in contrast to other CAD programs. In method 700, the traversing is robust during dynamic modification of the model, such that the method of traversal is tolerant of additions, modifications, and removals of model elements during dynamic modifications to the model (operation 726).

Figure 8:
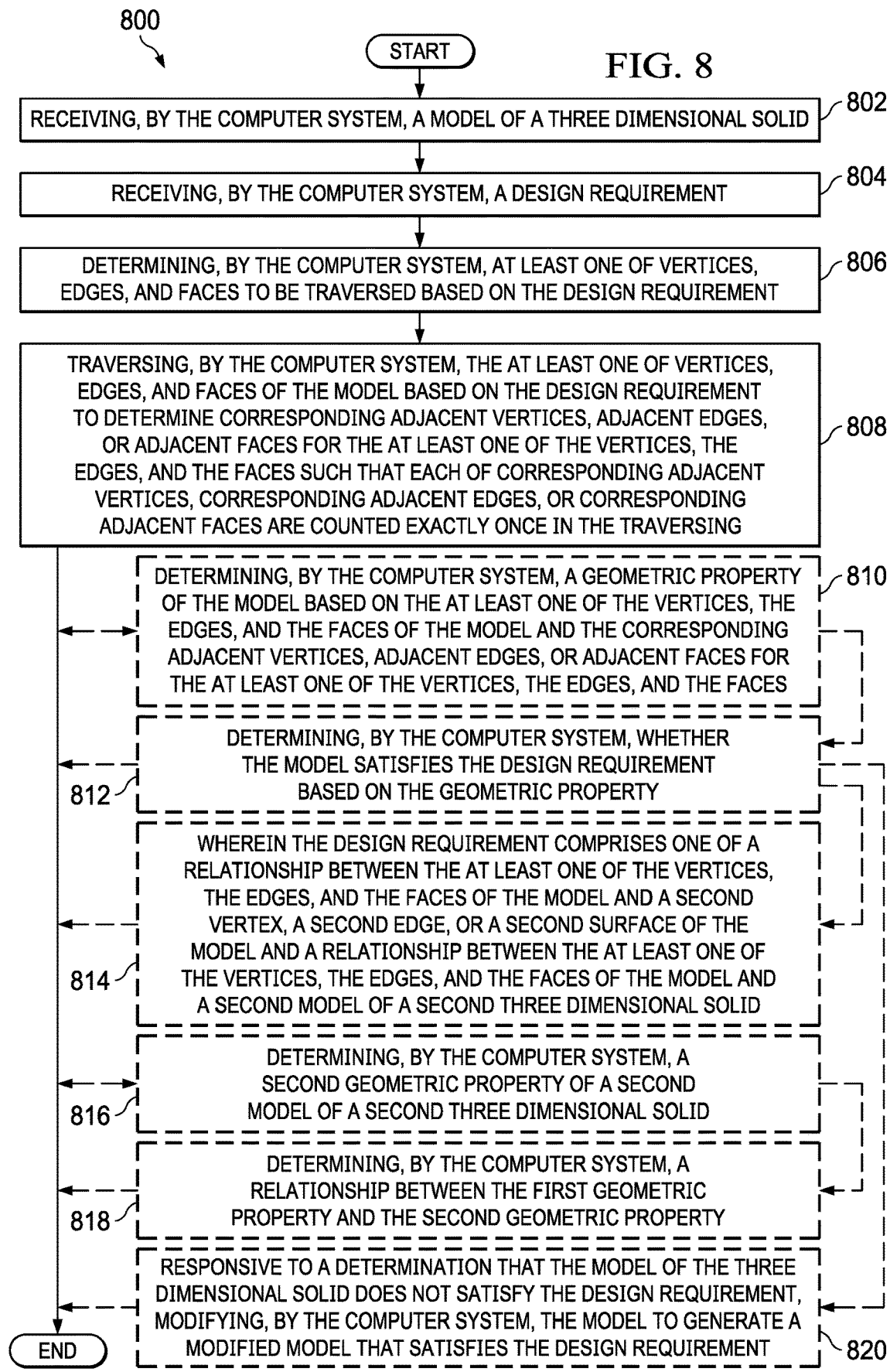
FIG. 8 is an illustration of a flowchart of a computer-implemented method of designing solid models in accordance with an illustrative embodiment.

Turning now to FIG. 8, an illustration of a flowchart of a computer-implemented method of designing solid models is depicted in accordance with an illustrative embodiment. Method 800 can be used to design or analyze a component of aircraft 100. Method 800 can be implemented in computer system 202 of FIG. 2. Method 800 can be used in designing solid model 300 of FIG. 3. Method 800 can be used in designing solid model 400 of FIG. 4. Method 800 can be used in designing solid model 500 of FIG. 5. Method 800 can be used in designing solid model 600 of FIG. 6.

Method 800 receive, by the computer system, a model of a three dimensional solid (operation 802). Method 800 receives, by the computer system, a design requirement (operation 804). Method 800 determines, by the computer system, at least one of vertices, edges, and faces to be traversed based on the design requirement (operation 806). Depending upon the design requirement, different ones of the vertices, edges, or faces are used to determine whether the model satisfies the design requirement. Accordingly, depending upon the design requirement, different ones of the vertices, edges, or faces are desirably traversed to determine if the design requirement is satisfied. Not all of the vertices, edges, and faces will always be traversed for each design requirement.

Method 800 traverses, by the computer system, the at least one of vertices, edges, and faces of the model based on the design requirement to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traversing, wherein the traversing is configured to be performed on the model independent of whether the model is a manifold solid or a non-manifold solid (operation 808). By traversing based on the design requirement, the at least one of vertices, edges, and faces of the model are traversed in an order that is desirable for the design requirement. Afterwards, method 800 terminates.

In some illustrative examples, method 800 further comprises determining, by the computer system, a geometric property of the model based on the at least one of the vertices, the edges, and the faces of the model and the corresponding adjacent vertices, adjacent edges, or adjacent faces for the at least one of the vertices, the edges, and the faces (operation 810). In some illustrative examples, method 800 determines, by the computer system, whether the model satisfies the design requirement based on the geometric property (operation 812).

In some illustrative examples, the design requirement comprises one of a relationship between the at least one of the vertices, the edges, and the faces of the model and a second vertex, a second edge, or a second face of the model and a relationship between the at least one of the vertices, the edges, and the faces of the model and a second model of a second three dimensional solid (operation 814).

In some illustrative examples, the geometric property comprises a first geometric property and method 800 further comprises determining, by the computer system, a second geometric property of a second model of a second three dimensional solid (operation 816), and determining, by the computer system, a relationship between the first geometric property and the second geometric property (operation 818). In some illustrative examples, method 800, responsive to a determination that the model of the three dimensional solid does not satisfy the design requirement, modifies, by the computer system, the model to generate a modified model that satisfies the design requirement (operation 820).

As used herein, the phrase "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations. The item may be a particular object, thing, or a category. In other words, at least one of means any combination items and number of items may be used from the list but not all of the items in the list are required.

As used herein, "a number of," when used with reference to items, means one or more items.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Some blocks may be optional. For example, any of operation 708 through operation 726 may be optional. As another example, any of operation 810 through operation 820 may be optional.

Figure 9:
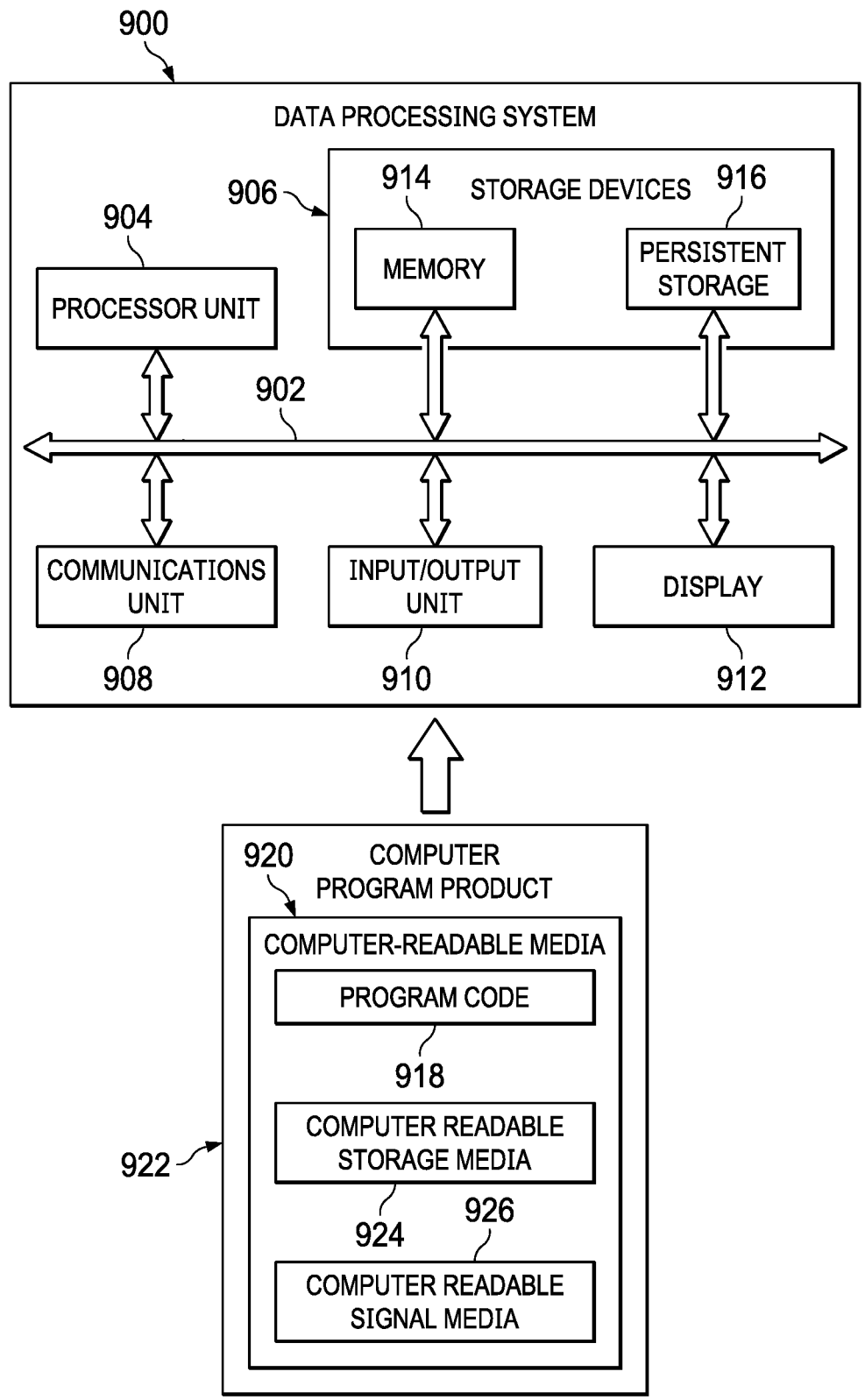
FIG. 9 is an illustration of a block diagram of a data processing system in accordance with an illustrative embodiment.

Turning now to FIG. 9, an illustration of a block diagram of a data processing system is depicted in accordance with an illustrative embodiment. Data processing system 900 may be used to implement computer system 202 in FIG. 2. In this illustrative example, data processing system 900 includes communications framework 902, which provides communications between processor unit 904, storage devices 906, persistent storage 916, communications unit 908, input/output unit 910, and display 912. In this example, communications framework 902 may take the form of a bus system.

Processor unit 904 serves to execute instructions for software that may be loaded into one of storage devices 906. Processor unit 904 may be a number of processors, a multi-processor core, or some other type of processor, depending on the particular implementation. In an embodiment, processor unit 904 comprises one or more conventional general-purpose central processing units (CPUs). In an alternate embodiment, processor unit 904 comprises one or more graphical processing units (GPUs).

Memory 914 and persistent storage 916 are examples of storage devices 906. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 906 may also be referred to as computer-readable storage devices in these illustrative examples. Memory 914, in these examples, may be, for example, a random-access memory or any other suitable volatile or non-volatile storage device.

Persistent storage 916 may take various forms, depending on the particular implementation.

For example, persistent storage 916 may contain one or more components or devices. For example, persistent storage 916 may include a hard drive, a flash memory, a rewritable optical disk, a rewritable magnetic tape, or some combination of the above. The media used by persistent storage 916 also may be removable. For example, a removable hard drive may be used for persistent storage 916.

Storage devices 906 are connected to the bus system. In some illustrative examples, one of storage devices 906 stores program instructions to perform a method, such as method 700 or method 800. Processor unit 904 is connected to the bus system. In some illustrative examples, processor unit 904 executes the program instructions to receive a model of a three dimensional solid; determine at least one of vertices, edges, and faces for the model; and traverse the at least one of vertices, edges, and faces of the model to determine corresponding adjacent vertices, adjacent edges, or adjacent faces for the at least one of the vertices, the edges, and the faces such that each of corresponding adjacent vertices, corresponding adjacent edges, or corresponding adjacent faces are counted exactly once in the traverse.

Communications unit 908, in these illustrative examples, provides for communications with other data processing systems or devices. In these illustrative examples, communications unit 908 is a network interface card.

Input/output unit 910 allows for input and output of data with other devices that may be connected to data processing system 900. For example, input/output unit 910 may provide a connection for user input through at least one of a keyboard, a mouse, or some other suitable input device. Further, input/output unit 910 may send output to a printer. Display 912 provides a mechanism to display information to a user.

Instructions for at least one of the operating system, applications, or programs may be located in storage devices 906, which are in communication with processor unit 904 through communications framework 902. The processes of the different embodiments may be performed by processor unit 904 using computer-implemented instructions, which may be located in a memory, such as memory 914.

These instructions are referred to as program code, computer-usable program code, or computer-readable program code that may be read and executed by a processor in processor unit 904. The program code in the different embodiments may be embodied on different physical or computer-readable storage media, such as storage devices 906 including memory 914 or persistent storage 916.

Program code 918 is located in a functional form on computer-readable media 920 that is selectively removable and may be loaded onto or transferred to data processing system 900 for execution by processor unit 904. Program code 918 and computer-readable media 920 form computer program product 922 in these illustrative examples. In one example, computer-readable media 920 may be computer-readable storage media 924 or computer-readable signal media 926.

Further, as used herein, "computer-readable media 920" can be singular or plural. For example, program code 918 can be located in computer-readable media 920 in the form of a single storage device or system. In another example, program code 918 can be located in computer-readable media 920 that is distributed in multiple data processing systems. In other words, some instructions in program code 918 can be located in one data processing system while other instructions in in program code 918 can be located in one data processing system. For example, a portion of program code 918 can be located in computer-readable media 920 in a server computer while another portion of program code 918 can be located in computer-readable media 920 located in a set of client computers.

The different components illustrated for data processing system 900 are not meant to provide architectural limitations to the manner in which different embodiments can be implemented. In some illustrative examples, one or more of the components may be incorporated in or otherwise form a portion of, another component. For example, memory 914, or portions thereof, can be incorporated in processor unit 904 in some illustrative examples. The different illustrative embodiments can be implemented in a data processing system including components in addition to or in place of those illustrated for data processing system 900. Other components shown in FIG. 9 can be varied from the illustrative examples shown. The different embodiments can be implemented using any hardware device or system capable of running program code 918.

In these illustrative examples, computer-readable storage media 924 is a physical or tangible storage device used to store program code 918 rather than a medium that propagates or transmits program code 918. Alternatively, program code 918 may be transferred to data processing system 900 using computer-readable signal media 926.

Computer-readable signal media 926 may be, for example, a propagated data signal containing program code 918. For example, computer-readable signal media 926 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 900 are not meant to provide architectural limitations to the manner in which different embodiments may be implemented. The different illustrative embodiments may be implemented in a data processing system including components in addition to or in place of those illustrated for data processing system 900. Other components shown in FIG. 9 can be varied from the illustrative examples shown. The different embodiments may be implemented using any hardware device or system capable of running program code 918.

Figure 10:
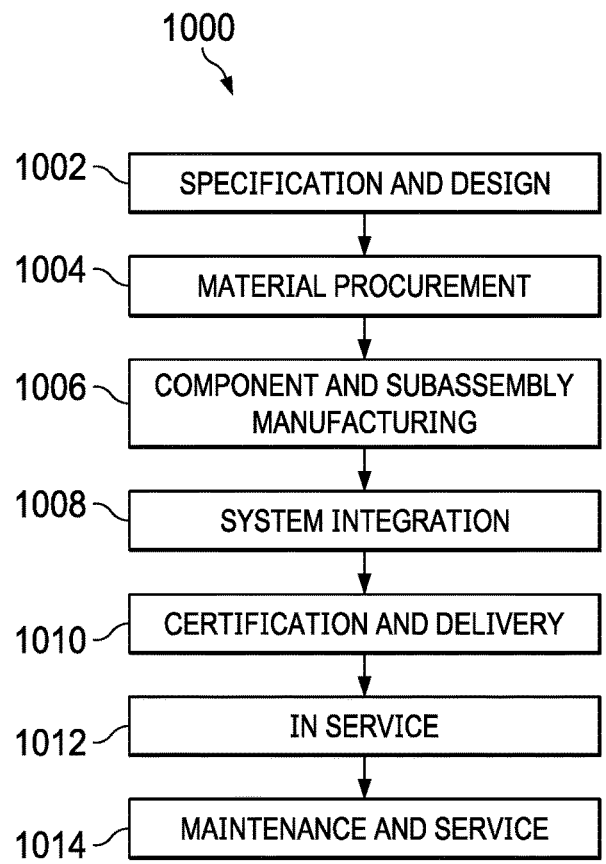
FIG. 10 is an illustration of an aircraft manufacturing and service method in the form of a block diagram in accordance with an illustrative embodiment.
Figure 11:
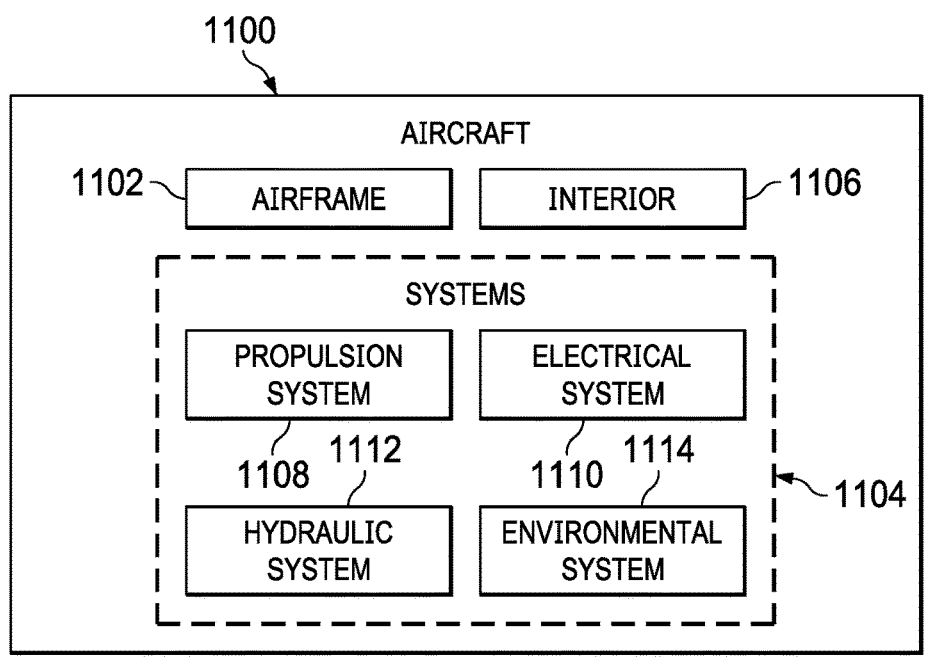
FIG. 11 is an illustration of an aircraft in the form of a block diagram in which an illustrative embodiment may be implemented.

Illustrative embodiments of the present disclosure may be described in the context of aircraft manufacturing and service method 1000 as shown in FIG. 10 and aircraft 1100 as shown in FIG. 11. Turning first to FIG. 10, an illustration of an aircraft manufacturing and service method is depicted in accordance with an illustrative embodiment. During pre-production, aircraft manufacturing and service method 1000 may include specification and design 1002 of aircraft 1100 in FIG. 11 and material procurement 1004.

During production, component and subassembly manufacturing 1006 and system integration 1008 of aircraft 1100 takes place. Thereafter, aircraft 1100 may go through certification and delivery 1010 in order to be placed in service 1012. While in service 1012 by a customer, aircraft 1100 is scheduled for routine maintenance and service 1014, which may include modification, reconfiguration, refurbishment, or other maintenance and service.

Each of the processes of aircraft manufacturing and service method 1000 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 11, an illustration of an aircraft is depicted in which an illustrative embodiment may be implemented. In this example, aircraft 1100 is produced by aircraft manufacturing and service method 1000 of FIG. 10 and may include airframe 1102 with plurality of systems 1104 and interior 1106. Examples of systems 1104 include one or more of propulsion system 1108, electrical system 1110, hydraulic system 1112, and environmental system 1114. Any number of other systems may be included.

Apparatuses and methods embodied herein may be employed during at least one of the stages of aircraft manufacturing and service method 1000. One or more illustrative embodiments may be manufactured or used during at least one of component and subassembly manufacturing 1006, system integration 1008, in service 1012, or maintenance and service 1014 of FIG. 10.

Method 700 in FIG. 7 or method 800 in FIG. 8 can be performed during specification and design 1002 of method 1000. Logical reasoning system 262 in FIG. 2 can be used during specification and design 1002 of method 1000. Model 206 analyzed using logical reasoning system 262 in FIG. 2 can be used to manufacture a component in component and subassembly manufacturing 1006 of method 1000. Components designed or analyzed using logical reasoning system 262 can be operated during in service 1012 of method 1000. Products designed or analyzed using logical reasoning system 262 or using method 700 or method 800 can be a portion of airframe 1102, interior 1106, or any of systems 1104 of aircraft 1100.

Thus, the illustrative examples provide a method, computer system, and computer program product that can be used in the development and analysis of solid models. The illustrative examples provide the methods and computational foundation for a logical reasoning system that operates on the geometric and topological representations of solid models. These illustrative examples enable automated reasoning that incorporates engineering design knowledge and design rules for developing large-scale, integrated product designs. These illustrative examples in turn enable reductions in non-recurring and recurring engineering labor during product development, improved design quality and reduced development costs.

The illustrative examples provide the framework and methods for: 1. logical reasoning about solids and geometric models for product design; 2. declarative expression of design conditions (both positive and negative); 3. logical expressions as a foundation for geometric reasoning; 4. logical expressions as a foundation for feature extraction; 5. logical expressions as a foundation for expressing conditions in applying design rules; and 6. a foundation for shape grammars operating on (CAD) geometric models and assemblies.

The illustrative examples provide logical reasoning over a geometric representation of both manifold and non-manifold solids. Note that manifold solids are not closed under Boolean operations. Providing logical reasoning over both manifold and non-manifold solids provides an improvement over conventional CAD programs that are limited in geometries and implementations.

The illustrative examples provide logical reasoning from any of the topological elements to all its adjacent elements, e.g., models, solids, faces, edges, vertices, and including the adjacencies of non-manifold edges to all adjacent faces, and non-manifold vertices to all adjacent edges. The illustrative examples provide logical reasoning about of the geometric elements and their geometric values.

The illustrative examples described herein satisfy the requirements of logical traversal of solids for automated reasoning. For example, in the illustrative examples, the results are deterministic and persistent as the results are consistent from traversal to traversal. In the illustrative examples, traversals are reentrant, allowing multiple traversals over the same structure (but not necessarily multi-threaded). In the illustrative examples, the traversal data need not be stored in geometric data structures. In the illustrative examples, the traversals are robust in the context of dynamic modification of geometric models. For example, during dynamic modification, topological elements are added in a way that they impact a prior (possibly reentrant) traversal. If allowing dynamic modification of objects, objects are added to beginning of traversal lists.

The illustrative examples allow for development of large-scale, complex products using a CAD program. Using the illustrative examples allows for the production of feasible designs, closing the development business case, reducing the extensive non-recurring engineering costs, and doing so with the goal of breaking the development cost curve. The automated reasoning capabilities of these illustrative examples add significant capability for designing these complex systems more quickly and with less error.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for designing a solid model of a product, the solid model comprising non-manifold solids, the method comprising:

transforming a computer system to a logical reasoning system comprising a logical mechanism for traversing non-manifold solids in geometric and topological representations in the solid model, the non-manifold solids comprising non-manifold edges comprising an edge comprising a same vertex at both ends of the edge thus comprising multiple edge uses;

receiving, by the logical reasoning system, a model of a three dimensional solid comprising computer aided design interfaces to the geometric and topological representations in the model that are implementation specific to the model;

determining, by the logical reasoning system, at least one of: vertices, edges, and faces for the model;

traversing, using the logical mechanism, the at least one of vertices, edges, and faces of the non-manifold solids in the model and determining for the non-manifold solids: corresponding adjacent vertices, adjacent edges, or adjacent faces for the at least one of: the vertices, the edges, and the faces such that each of corresponding adjacent vertices, corresponding adjacent edges, or corresponding adjacent faces are counted exactly once in the traversing;

determining, by traversing the non-manifold solids, if the model satisfies or does not satisfy a design requirement of the product; generating manufacturing instructions for the product from the model; and manufacturing the product based on the manufacturing instructions.

2. The method of claim 1, further comprising:

the product comprising an aircraft comprising millions of parts represented in the model;

modifying, responsive to determining the model does not satisfy the design requirement, the model with topological elements added to a beginning of a traversal list;

the logical mechanism also traversing the at least one of: vertices, edges, and faces, of manifold solids in the model; and determining, by the computer system, a geometric property of the model based on the at least one of the vertices, the edges, and the faces of the model and the corresponding adjacent vertices, adjacent edges, or adjacent faces for the at least one of the vertices, the edges, and the faces.

3. The method of claim 1, wherein the design requirement comprises one of a relationship between the at least one of the vertices, the edges, and the faces of the model and a second vertex, a second edge, or a second face of the model and a relationship between the at least one of the vertices, the edges, and the faces of the model and a second model of a second three dimensional solid.

4. The method of claim 1, wherein the geometric property comprises a first geometric property and further comprising:

performing, responsive to determining that the model satisfies the design requirement, simulations of the product;

determining, by the logical reasoning system, a second geometric property of a second model of a second three dimensional solid; and determining, by the logical reasoning system, a relationship between the first geometric property and the second geometric property.

5. The method of claim 1, further comprising:

responsive to a determination that the model of the three dimensional solid does not satisfy the design requirement, modifying, by the computer system, the model to generate a modified model that satisfies the design requirement.

6. The method of claim 1, wherein results of the traversing are deterministic and persistent while avoiding storing data in geometric data structures.

7. The method of claim 1, wherein the traversing is reentrant allowing multiple simultaneous traversals over a same model along a single thread.

8. The method of claim 1, wherein traversal data is not stored in geometric data structures.

9. The method of claim 1, wherein the traversing is robust during dynamic modification of the model, such that the method of traversal is tolerant of additions, modifications, and removals of model elements during dynamic modifications to the model.

10. A computer system configured to modify a solid model for a product, wherein the solid model comprises non-manifold solids, wherein the the computer system comprises:

a bus system;

a storage device connected to the bus system, wherein the storage device stores program instructions configured to transform the computer system to a logical reasoning system that comprises a logical mechanism configured to traverse the non-manifold solids in geometric and topological representations in the solid model, wherein the non-manifold solids comprise non-manifold edges comprise an edge that comprises a same vertex at both ends of the edge and thereby multiple edge uses, and wherein the logical mechanism is configured to:

receive a model of a three dimensional solid that comprises computer aided design interfaces to the geometric and topological representations in the model that are implementation specific to the model;

determine at least one of vertices, edges, and faces for the model;

traverse the at least one of: vertices, edges, and faces of the non-manifold solids in the model and determine for the non-manifold solids: corresponding adjacent vertices, adjacent edges, or adjacent faces for the at least one of: the vertices, the edges, and the faces such that each of corresponding adjacent vertices, corresponding adjacent edges, or corresponding adjacent faces are counted exactly once in a traversal;

determine, based upon the traversal of the non-manifold solids, if the model satisfies or does not satisfy a design requirement of the product; generate manufacturing instructions for the product from the model; and manufacture the product based on the manufacturing instructions.

11. The computer system of claim 10, wherein the program instructions are further configured to:

traverse a manifold solid in the model;

determine, based upon the traversal of the manifold solid, if the model satisfies or does not satisfy a design requirement of the product; and determine a geometric property of the model based on the at least one of the vertices, the edges, and the faces of the model and the corresponding adjacent vertices, adjacent edges, or adjacent faces for the at least one of the vertices, the edges, and the faces.

12. The computer system of claim 11, wherein the program instructions further comprise program instructions configured to:

determine, based upon the traversal of a manifold solid in the model, whether the model satisfies or does not satisfy the design requirement of the product;

generate from the model, responsive to a determination that the model satisfies the design requirement of the product, manufacturing instructions for the product.

13. The computer system of claim 12, wherein the design requirement comprises one of a relationship between the at least one of the vertices, the edges, and the faces of the model and a second vertex, a second edge, or a second face of the model and a relationship between the at least one of the vertices, the edges, and the faces of the model and a second model of a second three dimensional solid.

14. The computer system of claim 12, wherein the geometric property comprises a first geometric property and wherein the program instructions further comprise program instructions configured to:

determine a second geometric property of a second model of a second three dimensional solid; and determining a relationship between the first geometric property and the second geometric property.

15. The computer system of claim 12, wherein the program instructions further comprise program instructions configured to:

responsive to a determination that the model of the three dimensional solid does not satisfy the design requirement, modify the model with topological elements added to a beginning of a traversal list to generate a modified model that satisfies the design requirement.

16. The computer system of claim 10, wherein results of a traversal are deterministic, persistent, and free from storage of additional data in geometric data structures.

17. The computer system of claim 10, wherein the program instructions to the at least one of: the vertices, the edges, and the faces of the model is reentrant allowing multiple traversals over a same model along a single thread.

18. The computer system of claim 10, wherein traversal data is not stored in geometric data structures.

19. The computer system of claim 10, wherein the program instructions to traverse is robust during a dynamic modification of the model.

20. A computer program product that comprises:
a non-transitory computer-readable storage medium including instructions configured to organize data sets for a product that comprises millions of parts, wherein the instruction comprise:
a first program code configured to receive a model of the product that comprises computer aided design interfaces to geometric and topological representations in the model that are implementation specific to the model and comprises non-manifold solids:
a second program code configured to determine at least one of vertices, edges, and faces for the model; and
a third program code configured to:
transform the computer program product to a logical reasoning system that comprises a logical mechanism configured to traverse the non-manifold solids in geometric and topological representations in the model, wherein the non-manifold solids comprise an edge that comprises a same vertex at both ends of the edge and thereby multiple edge uses;
traverse the at least one of: vertices, edges, and faces of the non-manifold solids in the model and determine for the non-manifold solids: corresponding adjacent vertices, adjacent edges, or adjacent faces for the at least one of: the vertices, the edges, and the faces such that each of corresponding adjacent vertices, corresponding adjacent edges, or corresponding adjacent faces are counted exactly once in a traversal;
determine, based upon the traversal of the non-manifold solids, if the model satisfies or does not satisfy a design requirement of the product;
generate from the model, responsive to a determination that the model satisfies the design requirement of the product, manufacturing instructions for the product; generate manufacturing instructions for the product form the model; and manufacture the product based on the manufacturing instructions.

21. A method in a computer system for designing a model for a product comprising millions of parts, the model comprising non-manifold solids, the method comprising:
transforming a computer system to a logical reasoning system comprising a logical mechanism for traversing non-manifold solids in geometric and topological representations in the model, the non-manifold solids comprising non-manifold edges comprising an edge comprising a same vertex at both ends of the edge thus comprising multiple edge uses;
receiving, by the logical reasoning system, a model of a three dimensional solid comprising computer aided design interfaces to the geometric and topological representations in the model that are implementation specific to the model;
receiving, by the logical reasoning system, a design requirement;
determining, by the logical reasoning system, at least one of vertices, edges, and faces to be traversed based on the design requirement;
traversing, using the logical mechanism, the at least one of: vertices, edges, and faces of the non-manifold solids in the model and determining for the non-manifold solids: corresponding adjacent vertices, adjacent edges, or adjacent faces for the at least one of the vertices, the edges, and the faces such that each of corresponding adjacent vertices, corresponding adjacent edges, or corresponding adjacent faces are counted exactly one in the traversing;
determining, by traversing the non-manifold solids, if the model satisfies or does not satisfy a design requirement of the product; generating manufacturing instructions for the product form the model; and manufacturing the product based on the manufacturing instructions.

22. The method of claim 21, further comprising:
determining, by the computer system, a geometric property of the model based on the at least one of: the vertices, the edges, and the faces of the model and the corresponding adjacent vertices, adjacent edges, or adjacent faces for the at least one of the vertices, the edges, and the faces;
the product comprising an aircraft comprising millions of parts represented in the model; and
modifying, responsive to determining the model does not satisfy the design requirement, the model with topological elements added to the beginning of a traversal list.

23. The method of claim 21, wherein:
the logical mechanism also traversing manifold solids in the model; and
the design requirement comprising one of:
a relationship between the at least one of the vertices, the edges, and the faces of the model and a second vertex, a second edge, or a second face of the model; or
a relationship between the at least one of the vertices, the edges, and the faces of the model and a second model of a second three dimensional solid.

24. The method of claim 22, wherein the geometric property comprises a first geometric property and further comprising:
determining, by the computer system, a second geometric property of a second model of a second three dimensional solid; and
determining, by the computer system, a relationship between the first geometric property and the second geometric property.

25. The method of claim 22, further comprising:
responsive to a determination that the model of the three dimensional solid does satisfy the design requirement: performing simulations of the product.

* * * * *

UNITED STATES PATENT AND TRADEMARK OFFICE
CERTIFICATE OF CORRECTION

PATENT NO. : 12,361,181 B2
APPLICATION NO. : 17/305300
DATED : July 15, 2025
INVENTOR(S) : Jeff Alan Heisserman Page 1 of 1

It is certified that error appears in the above-identified patent and that said Letters Patent is hereby corrected as shown below:

In the Claims

Column 22, Line 46, correct "product;" to read -- product; and --
Column 23, Line 27, correct "comprises" to read -- comprise --
Column 23, Line 54, correct "form" to read -- from --

Signed and Sealed this
Twenty-sixth Day of August, 2025

Coke Morgan Stewart
*Acting Director of the United States Patent and Trademark Office*